United States Patent
Moriguchi et al.

(10) Patent No.: US 8,701,964 B2
(45) Date of Patent: Apr. 22, 2014

(54) COATED ROTARY TOOL

(75) Inventors: Hideki Moriguchi, Itami (JP); Yoshiharu Utsumi, Itami (JP); Hiroka Miyazaki, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/516,396

(22) PCT Filed: Dec. 13, 2010

(86) PCT No.: PCT/JP2010/072365
§ 371 (c)(1),
(2), (4) Date: Jun. 15, 2012

(87) PCT Pub. No.: WO2011/074530
PCT Pub. Date: Jun. 23, 2011

(65) Prior Publication Data
US 2012/0248175 A1    Oct. 4, 2012

(30) Foreign Application Priority Data

Dec. 17, 2009   (JP) ................................. 2009-286631

(51) Int. Cl.
*B23K 20/12*   (2006.01)
(52) U.S. Cl.
USPC ........................................ 228/2.1; 228/112.1
(58) Field of Classification Search
None
See application file for complete search history.

(56) References Cited

U.S. PATENT DOCUMENTS

| | | | |
|---|---|---|---|
| 5,460,317 A | | 10/1995 | Thomas et al. |
| 5,580,653 A | * | 12/1996 | Tanaka et al. ................. 428/336 |
| 5,656,383 A | * | 8/1997 | Tanaka et al. ................. 428/627 |
| 6,296,928 B1 | * | 10/2001 | Yamada et al. ............... 428/216 |
| 6,309,738 B1 | * | 10/2001 | Sakurai ......................... 428/216 |
| 7,828,191 B2 | * | 11/2010 | Ohashi et al. .................. 228/2.1 |
| 7,837,082 B2 | * | 11/2010 | Christopherson, Jr. ........ 228/2.1 |
| 2004/0118899 A1 | | 6/2004 | Aota et al. |
| 2004/0137281 A1 | * | 7/2004 | Ishikawa ....................... 428/702 |
| 2005/0129565 A1 | * | 6/2005 | Ohriner et al. ................ 420/431 |
| 2005/0249978 A1 | * | 11/2005 | Yao ............................... 428/699 |
| 2006/0169740 A1 | * | 8/2006 | Fukuhara et al. .............. 228/2.1 |
| 2006/0175584 A1 | * | 8/2006 | Kwon et al. ................. 252/520.2 |
| 2008/0023524 A1 | * | 1/2008 | Ohashi et al. .................. 228/2.1 |
| 2009/0123778 A1 | | 5/2009 | Russell et al. |
| 2009/0212089 A1 | * | 8/2009 | Christopherson, Jr. ........ 228/1.1 |
| 2010/0258612 A1 | * | 10/2010 | Kolbeck et al. ................ 228/2.1 |

(Continued)

FOREIGN PATENT DOCUMENTS

JP   07-505090    6/1995
JP   2003-326372 A   11/2003

(Continued)

*Primary Examiner* — Kiley Stoner
(74) *Attorney, Agent, or Firm* — Venable LLP; Michael A. Sartori; Tamatane J. Aga

(57) ABSTRACT

There is provided a tool for friction stir welding, which is capable of promoting temperature rise of materials to be joined during joining to achieve friction stir welding in a short time, is excellent in heat insulating property of a coating layer, and is excellent in oxidation resistance and wear resistance. A tool for friction stir welding according to the present invention is a tool for friction stir welding including a base material and a coating layer formed on the base material, wherein the coating layer is formed of one or more layers, and at least one layer of the coating layer has a thermal permeability of 5000 $J/s^{0.5} \cdot m^2 \cdot K$ or less.

10 Claims, 2 Drawing Sheets

(56) References Cited

U.S. PATENT DOCUMENTS

| | | | |
|---|---|---|---|
| 2010/0288817 A1* | 11/2010 | Yao | 228/2.1 |
| 2011/0274943 A1* | 11/2011 | Fujii et al. | 428/615 |
| 2011/0309131 A1* | 12/2011 | Hovanski et al. | 228/124.1 |
| 2012/0070686 A1* | 3/2012 | Ren | 428/638 |
| 2012/0228361 A1* | 9/2012 | Christopherson, Jr. | 228/1.1 |

FOREIGN PATENT DOCUMENTS

| | | | |
|---|---|---|---|
| JP | 2003-532542 A | | 11/2003 |
| JP | 2004-082144 A | | 3/2004 |
| JP | 2004-090050 A | * | 3/2004 |
| JP | 2004-195525 A | | 7/2004 |
| JP | 2005-152909 A | | 6/2005 |
| JP | 2007-237258 A | * | 9/2007 |
| JP | 2007-268605 A | | 10/2007 |
| JP | 2008-030096 A | * | 2/2008 |
| JP | 2009-072790 A | | 4/2009 |
| JP | 2009-525181 A | | 7/2009 |
| JP | 2009-537325 A | | 10/2009 |
| JP | 2010-194591 A | * | 9/2010 |
| WO | WO-01/85384 A1 | | 11/2001 |
| WO | WO-2007/089890 A2 | | 8/2007 |

* cited by examiner

COATED ROTARY TOOL

TECHNICAL FIELD

The present invention relates to a tool for friction stir welding.

BACKGROUND ART

In 1991, a friction stir welding technique of joining metal materials such as aluminum alloys was established in the United Kingdom. This technique is for joining metal materials by pressing a cylindrical tool for friction stir welding having a small-diameter protrusion at a tip thereof against joint surfaces of the metal materials to be joined and rotating the tool for friction stir welding, generating frictional heat, and softening and plastically flowing the metal materials at a joint portion by the frictional heat (Japanese National Patent Publication No. 07-505090 (PTL 1)).

"Joint portion" herein refers to a joint interface portion where joining of metal materials by butting the metal materials or placing one metal material on top of the other metal material is desired. Near this joint interface, the metal materials are softened, plastic flow occurs, and the metal materials are stirred. As a result, the joint interface disappears and joining is performed. Furthermore, dynamic recrystallization occurs at the metal materials at the same time. Due to this dynamic recrystallization, the metal materials near the joint interface become fine particles and the metal materials can be joined with high strength.

When aluminum alloys are used as the above-mentioned metal materials, plastic flow occurs at a relatively low temperature of approximately 500° C. Therefore, even when the tool for friction stir welding made of inexpensive tool steel is used, little wear and tear occurs and frequent replacement of the tool for friction stir welding is unnecessary. Therefore, in the friction stir welding technique, the cost required to join the aluminum alloys is low. Thus, in place of a resistance welding method for melting and joining aluminum alloys, the friction stir welding technique has already been in practical use in various applications as a technique of joining components of a railroad vehicle, a vehicle or an aircraft.

At present, the friction stir welding technique is mainly applied to nonferrous metals such as an aluminum alloy or a magnesium alloy in which plastic flow occurs at a relatively low temperature. This friction stir welding technique is superior to the resistance welding method in terms of cost and time required for joining, strength of the joint portion, and the like. Therefore, there is a need for applying the friction stir welding technique to not only joining of the materials in which plastic flow occurs at a low temperature, but also joining of copper alloys or steel materials in which plastic flow occurs at a high temperature of 1000° C. or higher.

However, when the friction stir welding technique is applied to the steel materials, the tool for friction stir welding itself is exposed to a high temperature during joining. As a result, the tool for friction stir welding is plastically deformed, and a portion of the tool for friction stir welding that is in contact with the materials to be joined is easily oxidized and becomes worn, which leads to remarkably short tool life.

As an attempt to solve the above-mentioned problem, Japanese Patent Laying-Open No. 2003-326372 (PTL 2), for example, discloses a tool for friction stir welding, in which a portion of a surface of the tool for friction stir welding that is in contact with materials to be joined is coated with a diamond film, thereby increasing the surface hardness, suppressing welding, to the tool for friction stir welding, of low-melting-point light alloy component such as an Al alloy or a Mg alloy serving as the materials to be joined, and lengthening the tool life. According to the tool for friction stir welding as disclosed in PTL 2, the wear resistance of the surface thereof can be enhanced and the tool life can be lengthened.

However, the diamond film has a very high thermal conductivity. Therefore, a part of frictional heat generated due to rotation of the tool for friction stir welding escapes to the tool for friction stir welding side, and sufficient conduction of the frictional heat to the materials to be joined side becomes difficult. As a result, an enormous time is required from when a small-diameter protrusion of the tool for friction stir welding is pressed against the materials to be joined to when plastic flow occurs.

In the case of joining of the materials in which plastic flow occurs at a high temperature, the tool for friction stir welding must be rotated at a high speed in order to speed up temperature rise of the materials to be joined. Therefore, if it takes time before plastic flow of the materials to be joined occurs, it is impossible to enjoy such an advantage of the friction stir welding technique that cost and time required for joining can be reduced. As an attempt to solve the above-mentioned problem, Japanese National Patent Publication No. 2003-532542 (PTL 3) discloses a technique of providing a heat flow barrier such that heat is not conducted to a shaft portion of a tool for friction stir welding. Provision of the heat flow barrier as mentioned above allows frictional heat to concentrate on materials to be joined.

As another attempt to suppress deterioration of the surface of the tool for friction stir welding, Japanese Patent Laying-Open No. 2005-152909 (PTL 4) discloses a tool for friction stir welding, including an underlying layer provided on a base material, and an anti-adhesion coating made of TiN, TiAlN or the like and provided on the underlying layer. According to this tool for friction stir welding, adhesion of a metal component (aluminum) in materials to be joined can be prevented in spite of long-term use, and thus, stable processing can be continued.

CITATION LIST

Patent Literature

PTL 1: Japanese National Patent Publication No. 07-505090
PTL 2: Japanese Patent Laying-Open No. 2003-326372
PTL 3: Japanese National Patent Publication No. 2003-532542
PTL 4: Japanese Patent Laying-Open No. 2005-152909

SUMMARY OF INVENTION

Technical Problem

However, when the tool for friction stir welding having the anti-adhesion coating as described in PTL 4 is applied to processing of a difficult-to-join material such as steel having a melting point of 1000° C. or higher, the surface of the tool for friction stir welding is exposed to a high temperature of 1000° C. or higher, the generated frictional heat is thermally conducted to the base material and the base material is plastically deformed easily. Therefore, sufficiently-long tool life cannot be obtained.

In particular, the anti-adhesion coating in PTL 4 has a high thermal permeability. Therefore, the frictional heat generated due to rotation with respect to the materials to be joined is thermally conducted to the base material, and the frictional heat cannot be sufficiently transmitted to the materials to be joined. Thus, it takes time before the temperature of the materials to be joined rises and plastic flow occurs.

The present invention has been made in view of the above-mentioned circumstances, and an object of the present invention is to provide a tool for friction stir welding, which is capable of speeding up temperature rise of the materials to be joined during joining and causing plastic flow of the materials to be joined in a short time to achieve efficient friction stir welding, allows excellent joining at a low rotation speed, and is excellent in oxidation resistance and wear resistance.

Solution to Problem

A tool for friction stir welding according to the present invention is a tool for friction stir welding including a base material and a coating layer formed on the base material, wherein the coating layer is formed of one or more layers, and at least one layer of the coating layer has a thermal permeability of 5000 $J/s^{0.5} \cdot m^2 \cdot K$ or less. Preferably, a layer, which has a maximum thickness, of the coating layer has the thermal permeability of 5000 $J/s^{0.5} \cdot m^2 \cdot K$ or less.

Preferably, the coating layer includes one or more first heat insulating layers, the first heat insulating layer has the thermal permeability of 5000 $J/s^{0.5} \cdot m^2 \cdot K$ or less and is formed by a compound which is nitride or oxide of Al and of at least one or more elements selected from the group consisting of Ti, Si, Zr, Hf, and Cr, or a solid solution of the compound, and an atomic ratio of the Al to metal elements contained in the first heat insulating layer is 60% or more.

Preferably, the coating layer includes one or more second heat insulating layers, the second heat insulating layer has the thermal permeability of 5000 $J/s^{0.5} \cdot m^2 \cdot K$ or less and is formed by a compound which is nitride or oxide of Si and of at least one or more elements selected from the group consisting of Al, Ti, Zr, Hf, and Cr, or a solid solution of the compound, and an atomic ratio of the Si to metal elements contained in the second heat insulating layer is 50% or more. Preferably, the coating layer includes a hexagonal crystal structure and/or an amorphous structure.

Preferably, the tool for friction stir welding has a chuck portion inserted into a holder, and the coating layer is formed on all or a part of a portion of the base material other than the chuck portion.

Preferably, the coating layer is formed at least on a portion of the base material that comes into contact with materials to be joined during joining processing. Preferably, the coating layer does not have a crack extending from a surface of the coating layer to the base material. Preferably, at least one layer of the coating layer is formed by a physical vapor deposition method.

The present invention is directed to a method for joining materials to be joined using the tool for friction stir welding, wherein the joining is performed on the materials to be joined having a melting point of 1000° C. or higher.

The above-mentioned tool for friction stir welding according to the present invention can be suitably used to join the materials to be joined that are made of a high-melting-point material.

Advantageous Effects of Invention

Since the tool for friction stir welding according to the present invention has the above-mentioned configuration, the tool for friction stir welding according to the present invention produces such effects that temperature rise of the materials to be joined is promoted during joining to achieve friction stir welding in a short time, the coating layer has excellent heat insulating property, and excellent oxidation resistance and wear resistance are achieved. The tool for friction stir welding having the above-mentioned configuration is simple and inexpensive as compared with the structure in PTL 2 including the heat flow barrier made of a different type of material. In addition, in the tool for friction stir welding, the temperature of the base material does not rise easily, joining in a short time is possible, and excellent wear resistance can be achieved.

DESCRIPTION OF EMBODIMENTS

The present invention will be described in more detail hereinafter.

<Tool for Friction Stir Welding>

Figure 1:
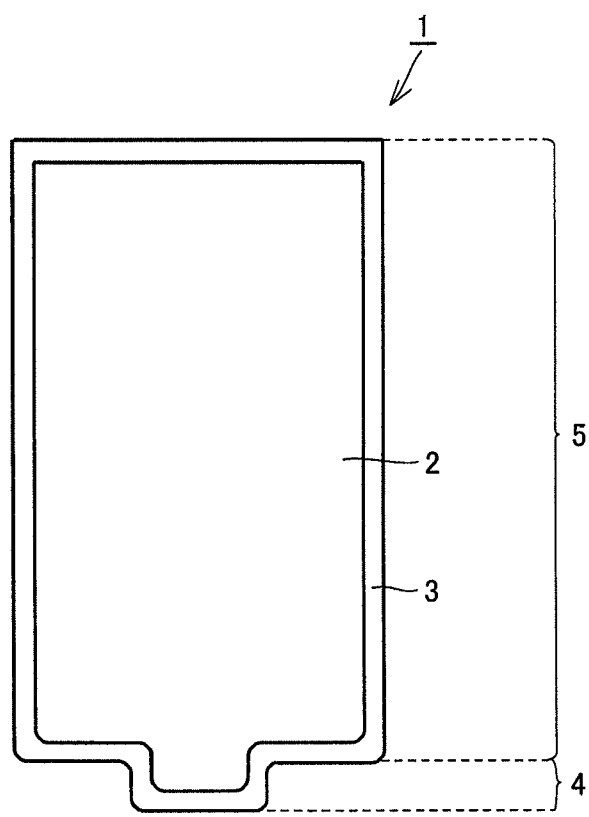
FIG. 1 is a schematic cross-sectional view showing one example of a tool for friction stir welding according to the present invention.

FIG. 1 is a schematic cross-sectional view of a tool for friction stir welding according to the present invention. As shown in FIG. 1, a tool 1 for friction stir welding according to the present invention includes a base material 2 and a coating layer 3 formed on base material 2. Tool 1 for friction stir welding according to the present invention having the above-mentioned configuration can be used very usefully in a friction stir welding (FSW) application, a friction spot joining (FSJ) application and the like, for example. Tool 1 for friction stir welding according to the present invention is shaped to include a probe portion 4 having a small diameter (e.g., a diameter of 2 mm or more and 8 mm or less) and a cylindrical portion 5 having a large diameter (e.g., a diameter of 4 mm or more and 20 mm or less). When this is used for joining, probe portion 4 is rotated, with probe portion 4 inserted into or pressed against a joint portion of materials to be joined, and thereby the materials to be joined are joined. In this case, in the friction stir welding application, probe portion 4 is pressed against or inserted into two materials to be joined that are stacked or butted in a line contact manner, and rotating probe portion 4 is moved linearly with respect to the stacked or butted portion, and thereby the materials to be joined are joined. On the other hand, in the friction spot joining application, rotating probe portion 4 is pressed against a desired joint spot of two materials to be joined that are vertically stacked or butted, and rotation of probe portion 4 is continued at this location, and thereby the materials to be joined are joined.

The present invention also relates to a method for joining materials to be joined using the tool for friction stir welding, wherein joining can be performed on the materials to be joined having a melting point of 1000° C. or higher. Using the tool for friction stir welding according to the present invention, joining can also be performed on the materials to be joined having a melting point of 1000° C. or higher, which has been considered to be difficult conventionally. Therefore, the tool for friction stir welding according to the present invention has very excellent industrial applicability.

As mentioned above, tool 1 for friction stir welding according to the present invention can be used in various applications, and particularly, can be suitably used for joining of high-tensile steel, for which the resistance welding method has been mainly used conventionally. In other words, in the above-mentioned joining of high-tensile steel, tool 1 for friction stir welding according to the present invention provides an alternative to the conventional resistance welding method. In friction stir welding, the materials to be joined are joined in a solid-phase state and dynamic recrystallization occurs at the joint portion, and thus, the structure becomes fine. As a result, the strength of the joint portion is increased as compared with the conventional resistance welding method in which the materials to be joined change into a liquid phase during joining. Therefore, the tool for friction stir welding according to the present invention can be very effectively used for joining of high-tensile steel having high specific strength, and in particular, joining of ultrahigh-tensile steel of 980 MPa or more.

Figure 2:
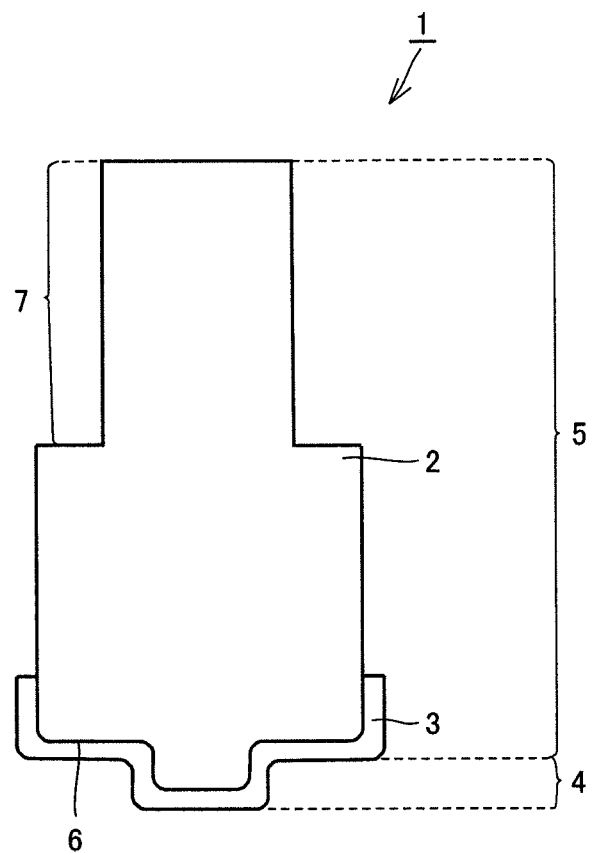
FIG. 2 is a schematic cross-sectional view showing another example of the tool for friction stir welding according to the present invention.

FIG. 2 is a schematic cross-sectional view of a preferable embodiment of the tool for friction stir welding according to the present invention. As shown in FIG. 2, tool 1 for friction stir welding according to the present invention preferably has a chuck portion 7 such that cylindrical portion 5 is inserted into a holder. This chuck portion 7 can be formed by cutting away a part of a side surface of cylindrical portion 5, for example. On the other hand, a portion that comes into contact with the materials to be joined during joining processing is also referred to as a shoulder portion 6.

Tool 1 for friction stir welding according to the present invention preferably includes base material 2, and coating layer 3 on all or a part of a portion of base material 2 other than chuck portion 7. Since coating layer 3 is not formed on a surface of chuck portion 7 on base material 2 as mentioned above, heat of tool 1 for friction stir welding whose temperature has risen due to conduction of frictional heat can escape to the holder with which tool 1 for friction stir welding is in contact, and thus, the temperature of base material 2 does not rise easily. Since temperature rise of base material 2 is prevented as mentioned above, the plastic deformation resistance and the wear resistance of tool 1 for friction stir welding can be enhanced.

As shown in FIG. 2, coating layer 3 is more preferably formed at least on a portion of base material 2 that comes into contact with the materials to be joined during joining processing. Since coating layer 3 is formed only on the portion that comes into contact with the materials to be joined as mentioned above, heat generated due to friction is easily released to the holder from a portion that does not have coating layer 3. As a result, the temperature of base material 2 does not rise easily, and thus, plastic deformation of base material 2 and shortening of the tool life can be prevented.

<Base Material>

A material that has been conventionally known as above-mentioned base material 2 for joining processing can be used without particular limitation as base material 2 of the tool for friction stir welding according to the present invention. Examples of above-mentioned base material 2 can include, for example, cemented carbide (e.g., WC-based cemented carbide, a material containing Co in addition to WC, or a material to which carbonitride or the like of Ti, Ta, Nb or the like is further added), cermet (mainly composed of TiC, TiN, TiCN or the like), high-speed steel, tool steel, ceramics (such as titanium carbide, silicon carbide, silicon nitride, aluminum nitride, aluminum oxide, sialon, and a mixture thereof), sintered cubic boron nitride, sintered diamond, a hard material having cBN particles dispersed therein, and the like.

When the cemented carbide is used as base material 2, the effects of the present invention are achieved even if the cemented carbide includes free carbon or an abnormal phase called η phase in the structure thereof.

<Coating Layer>

In the tool for friction stir welding according to the present invention, coating layer 3 formed on base material 2 is formed of one or more layers, and at least one layer of coating layer 3 has a thermal permeability of 5000 $J/s^{0.5} \cdot m^2 \cdot K$ or less. Since at least one layer having the above-mentioned thermal permeability is formed as coating layer 3, the frictional heat generated due to rotation of the tool for friction stir welding is not easily conducted to the base material side and is easily conducted to the materials to be joined. As a result, temperature rise of the materials to be joined is promoted, and plastic flow of the materials to be joined can be speeded up. More preferably, at least one layer of coating layer 3 as mentioned above has a thermal permeability of 4700 $J/s^{0.5} \cdot m^2 \cdot K$ or less, and further preferably 4200 $J/s^{0.5} \cdot m^2 \cdot K$ or less. It is to be noted that in the present invention, a value calculated by means of a thermophysical properties microscope (product name: Thermal Microscope TM3 (BETHEL Co.)) in accordance with a thermoreflectance method is employed as the thermal permeability of coating layer 3.

Coating layer 3 formed on base material 2 of tool 1 for friction stir welding according to the present invention includes one or more layers. In other words, this coating layer 3 may be formed of one layer having a single composition, or may be formed of two or more layers having different compositions. Since at least one layer of coating layer 3 in the present invention has a heat shield property such that the frictional heat does not easily permeate the base material, the effects of the present invention are achieved. Preferably, a layer of the coating layer having a maximum thickness has a thermal permeability of 5000 $J/s^{0.5} \cdot m^2 \cdot K$ or less, and more preferably, entire coating layer 3 has a thermal permeability of 5000 $J/s^{0.5} \cdot m^2 \cdot K$ or less.

Above-mentioned coating layer 3 is provided to give the above-mentioned property. In addition to this property, coating layer 3 can give an effect of enhancing various properties of tool 1 for friction stir welding such as wear resistance, oxidation resistance, toughness, and coloring property for identifying a used probe. In order to enhance particularly the oxidation resistance and the wear resistance of coating layer 3, coating layer 3 preferably includes one or more first heat insulating layers or second heat insulating layers having a thermal permeability of 5000 $J/s^{0.5} \cdot m^2 \cdot K$ or less.

The first heat insulating layer herein is formed by a compound which is nitride or oxide of Al and of at least one or more elements selected from the group consisting of Ti, Si, Zr, Hf, and Cr, or a solid solution of the compound, and the atomic ratio of the Al to the metal elements contained in the first heat insulating layer is 60% or more. On the other hand, the second heat insulating layer is formed by a compound which is nitride or oxide of Si and of at least one or more elements selected from the group consisting of Al, Ti, Zr, Hf, and Cr, or a solid solution of the compound, and the atomic ratio of the Si to the metal elements contained in the second heat insulating layer is 50% or more.

In the present invention, coating layer 3 preferably includes a hexagonal crystal structure and/or an amorphous structure. In particular, in the case of coating layer 3 including the amorphous structure, the frictional heat generated due to rotation is not easily conducted to the base material 2 side and is easily conducted to the materials to be joined. As a result, temperature rise of the materials to be joined is promoted, and plastic flow of the materials to be joined can be speeded up.

Preferably, the above-mentioned coating layer does not have a crack extending from a surface of the coating layer to the base material. Since the coating layer does not have the above-mentioned crack, there can be prevented inflow of oxygen to the base material through the crack and oxidation of the base material under a high-temperature environment created by the frictional heat generated due to rotation of the tool. Therefore, the problem of shortening of the tool life can be solved.

In addition, in the present invention, at least one layer of coating layer 3 must be formed to achieve high adhesiveness to base material 2, and thus, at least one layer of coating layer 3 is preferably formed by a film forming process that allows high adhesiveness to base material 2. Any conventionally known film forming processes can be used as the above-mentioned film forming process. For example, a PVD (physical vapor deposition) method, a CVD (chemical vapor deposition) method and the like can be used, and two or more conventionally known film forming processes may be combined.

Among these film forming processes, the use of the PVD method is particularly preferable because the coating layer is not easily cracked after coating layer 3 is formed, and the oxidation resistance can be enhanced. In the PVD method, coating layer 3 can be formed at a low temperature and coating layer 3 can be formed while creating distortion in coating layer 3, as compared with the CVD method. Therefore, crystal grains tend to become fine, and the coating layer having a low thermal permeability can be formed.

The conventionally known PVD method can be used without particular limitation as the PVD method suitably used in the present invention. The above-mentioned PVD method can include, for example, a sputtering method, an arc ion plating method, a vapor deposition method and the like. Particularly, the arc ion plating method or the magnetron sputtering method is preferably employed.

The coating layer in the present invention preferably has a thickness of 1 μm or more and 50 μm or less. Since the coating layer has a thickness of 1 μm or more as mentioned above, the wear resistance can be enhanced and the tool life can be significantly lengthened. More preferably, the coating layer in the present invention has a thickness of 1.5 μm or more and 30 μm or less, and further preferably 2 μm or more and 20 μm or less. As a result, the tool life can be further lengthened and excellent chipping resistance can also be achieved.

In the present invention, the thickness of the coating layer refers to the thickness of the coating layer at any portion of the surface of the tool for friction stir welding, and refers to, for example, the thickness of the coating layer at a tip of the probe portion, of the thickness of the coating layer formed on the base material of the tool for friction stir welding.

Although the coating layer in the present invention is preferably formed to coat the entire surface of the base material, even a coating layer that does not coat a part of the base material, or a coating layer having a different configuration at any portion on the base material does not depart from the scope of the present invention. The coating layer in the present invention is preferably formed at least on all or a part of the portion of the base material other than the chuck portion as mentioned above, and is more preferably formed at least on the portion that comes into contact with the materials to be joined during joining processing.

<Method for Forming Coating Layer>

As mentioned above, at least one layer of the coating layer in the present invention is preferably formed by the physical vapor deposition (PVD) method. At least one layer of the coating layer in the present invention can also be formed by any PVD methods as long as the PVD method is used, and the type of the forming method is not particularly limited.

When a small substrate bias voltage is applied to base material 2, the elements constituting coating layer 3 are supplied in an ionic state to the base material at low energy. Therefore, an impact when the elements collide with the base material becomes small and the crystallinity of the formed coating layer decreases. As a result, the thermal permeability of formed coating layer 3 can be reduced.

By controlling the substrate bias voltage, the base material temperature and ON/OFF of a heater when the surface region of coating layer 3 is formed, and configuring coating layer 3 such that coating layer 3 has a hexagonal or amorphous structure, at least one layer of the coating layer can have a thermal permeability of 5000 $J/s^{0.5} \cdot m^2 \cdot K$ or less.

Bombard processing prior to formation of coating layer 3 is an important step for improving consistency between crystal grains included in coating layer 3 and crystal grains of hard-phase particles such as WC included in the base material, in an interface region between base material 2 and coating layer 3. Specifically, after an argon gas is introduced, the substrate bias voltage is maintained at −1500 V, and the surface of the cemented carbide base material is subjected to the bombard processing while releasing thermal electrons in a W filament, and thereafter, coating layer 3 is formed. As a result, in the interface region between base material 2 and coating layer 3, the crystal grains included in coating layer 3 and the crystal grains of the hard-phase particles such as WC included in the base material can have consistency.

The reason for the above is considered as follows. Contamination and an oxide layer on the surface of the crystal grains of the hard-phase particles such as WC in the interface region can be removed by the bombard processing, and the degree of activity on the surface of the crystal grains of the hard-phase particles such as WC increases. As a result, the crystal grains in the coating layer grow in a manner consistent with the crystal grains of the hard-phase particles such as WC. Since the consistency between the crystal grains included in the coating layer and the crystal grains of the hard-phase particles such as WC included in the base material is improved as mentioned above, the bonding force between the coating layer and the crystal grains of the hard-phase particles such as WC (i.e., base material) is strengthened and excellent peeling resistance can be achieved.

EXAMPLE

While the present invention will be described in more detail hereinafter with reference to Examples, the present invention is not limited thereto. It is to be noted that the thickness of the coating layer in Examples was measured by directly observing a cross section of the coating layer by means of a scanning electron microscope (SEM).

Although the coating layer is formed by a cathode arc ion plating method in the following description, the coating layer can also be formed by, for example, a balanced or unbalanced sputtering method.

Example 1

In the present example, the tool for friction stir welding shown in FIG. 1 was fabricated. The tool for friction stir welding in the present example had cylindrical portion 5 having a substantially cylindrical shape whose diameter was 10 mm and whose height was 20 mm, and probe portion 4 protruding concentrically with cylindrical portion 5 at a central portion of the tip of cylindrical portion 5. Probe portion 4 had a substantially cylindrical shape whose diameter was 4 mm and whose height was 2 mm.

In the present example, a layer having a single composition was formed as the coating layer. However, even if a layer having a composition other than the composition used in the example or two or more layers having different compositions are formed as the coating layer, or even if at least a part of the coating layer includes a ultra-multilayer structure, the similar effects can be obtained as long as at least one layer of the coating layer has a thermal permeability of 5000 $J/s^{0.5} \cdot m^2 \cdot K$ or less.

<Fabrication of Tool for Friction Stir Welding>

First, a base material (base material No. 1) having the above-mentioned tool shape and made of a material shown in Table 1 below was prepared as the base material of the tool for friction stir welding. This base material was made of cemented carbide and included WC crystal grains, and the average particle size of each of these crystal grains (in the surface of the base material (interface portion with the coating layer)) was as shown in Table 1.

TABLE 1

| | | evaluation of wear resistance |
|---|---|---|
| base material | base material No. | No. 1 |
| | material of base material | WC-10 wt % Co |
| | average particle size of WC crystal grains | 1 μm |
| material to be joined | material | SPC270 |
| | tensile strength (MPa) | 270 |
| | plate thickness (mm) | 0.7 |
| joining condition | pressing pressure (N) | 6865 |
| | number of rotations (r.p.m) | 3000 |

Subsequently, the pressure within a chamber of the apparatus was lowered by means of a vacuum pump, and the base material was heated to 450° C. by means of a heater placed in the apparatus. The chamber was evacuated until the pressure within the chamber reached $1.0 \times 10^{-4}$ Pa.

Next, an argon gas was introduced and the pressure within the chamber was maintained at 3.0 Pa. The voltage of a substrate bias power supply of the base material was gradually raised to −1500 V, and cleaning of the surface of the base material was performed for 15 minutes while heating a W filament and releasing thermal electrons. Thereafter, the argon gas was discharged.

Then, in order to form $Al_{0.7}Ti_{0.3}N$ (thermal permeability: 4500 $J/s^{0.5} \cdot m^2 \cdot K$) to have a thickness shown in Table 2 below as the coating layer formed on the base material to be in direct contact therewith, a preset target of alloy serving as a metal evaporation source was used, a nitrogen gas serving as a reaction gas was introduced, the reaction gas pressure was set to 4.0 Pa, and the substrate bias voltage and the base material temperature were varied. In this manner, an arc current of 100 A was supplied to a cathode electrode and metal ions were generated from an arc-type evaporation source. The tool for friction stir welding in Example 1 including the coating layer having a thickness shown in Table 2 below was thus fabricated.

TABLE 2

| | coating layer | | | |
|---|---|---|---|---|
| | layer thickness (μm) | thermal permeability $(J/s^{0.5} \cdot m^2 \cdot K)$ | composition | portion of formation |
| Example 1 | 10 | 4500 | $Al_{0.7}Ti_{0.3}N$ | entire surface of base material |
| Example 2 | 10 | 5000 | $Al_{0.7}Cr_{0.3}O$ | entire surface of base material |
| Example 3 | 10 | 3000 | $SiO_{0.1}N_{0.9}$ (5 μm), $Ti_{0.5}Al_{0.5}N$ (5 μm) | entire surface of base material |
| Example 4 | 10 | 4200 | $Al_2O_3$ (1 μm), $Ti_{0.5}Al_{0.5}N$ (9 μm) | entire surface of base material |
| Example 5 | 20 | 4500 | $Al_{0.7}Ti_{0.3}N$ | probe portion + shoulder portion |
| Example 6 | 10 | 5000 | $Al_{0.7}Cr_{0.3}O$ | probe portion + shoulder portion |
| Example 7 | 5 | 3000 | $SiO_{0.1}N_{0.9}$ (2.5 μm), $Ti_{0.5}Al_{0.5}N$ (2.5 μm) | probe portion + shoulder portion |
| Example 8 | 2 | 4200 | $Al_2O_3$ (1 μm), $Ti_{0.5}Al_{0.5}N$ (1 μm) | probe portion + shoulder portion |
| Comparative Example 1 | 10 | 5900 | $Ti_{0.5}Al_{0.5}N$ | entire surface of base material |
| Comparative Example 2 | 10 | 8300 | $Ti_{0.9}Si_{0.1}N$ | entire surface of base material |
| Comparative Example 3 | 10 | 12000 | $TiC_{0.3}N_{0.7}$ | entire surface of base material |
| Comparative Example 4 | — | — | — | none |

Examples 2 to 4

In each of Examples 2 to 4 below, a tool for friction stir welding was fabricated using a method similar to that in Example 1 except that the configuration and composition of the coating layer were different from those in Example 1 as shown in Table 2 above. For example, in Example 3, $Ti_{0.5}Al_{0.5}N$ having a thickness of 5 μm was formed on the base material, and thereafter, $SiO_{0.1}N_{0.9}$ having a thickness of 5 μm was formed to form the coating layer. As mentioned above, when two types of compositions are listed in the section "composition" of coating layer in Table 2, it means that a layer having a composition shown on the right side is formed, and thereafter, a layer having a composition shown on the left side is formed directly on the layer.

In Examples 3, 4, 7, and 8 in Table 2, the coating layer including two layers, i.e., a layer made of $Ti_{0.5}Al_{0.5}N$ and a layer having a composition other than $Ti_{0.5}Al_{0.5}N$ is formed. However, in the section "thermal permeability" in Table 2, the thermal permeability of the layer having a composition other than $Ti_{0.5}Al_{0.5}N$ is shown, and the thermal permeability of the coating layer made of $Ti_{0.5}Al_{0.5}N$ is not shown because the thermal permeability thereof is 5900 $J/s^{0.5} \cdot m^2 \cdot K$.

In the tool for friction stir welding in each of Examples 1 to 4 fabricated as mentioned above, at least one layer of the coating layer has a thermal permeability of 5000 $J/s^{0.5} \cdot m^2 \cdot K$ or less.

Examples 5 to 8

In each of Examples 5 to 8 below, the tool for friction stir welding shown in FIG. 2 was fabricated. The tool for friction stir welding in each of Examples 5 to 8 had probe portion 4 similar to that in each of Examples 1 to 4, and had chuck portion 7 such that cylindrical portion 5 was inserted into the holder. This chuck portion 7 was formed by cutting away the side surface of cylindrical portion 5 by a length of 10 mm from an upper surface of cylindrical portion 5, from opposing two directions, and had a substantially cylindrical cross-sectional shape. When chuck portion 7 is viewed from the holder side, the length of a chord formed by cutting as mentioned above was 7 mm.

A jig was attached to a portion other than probe portion 4 and shoulder portion 6, and the base material having the above-mentioned shape was mounted on a cathode arc ion plating apparatus.

Thereafter, using a method similar to that in above-mentioned Example 1, cleaning of the surface of the base material was performed for 15 minutes. Then, the preset target of alloy serving as the metal evaporation source was used, and the substrate bias voltage and the base material temperature were varied. As a result, the coating layer having the configuration and thickness shown in Table 2 above was formed on probe portion 4 and shoulder portion 6.

Then, the base material was taken out from the apparatus, and the jig attached to the portion other than probe portion 4 and shoulder portion 6 was removed. The tool for friction stir welding in each of Examples 5 to 8 was thus fabricated.

In the tool for friction stir welding in each of Examples 5 to 8 fabricated as mentioned above, at least one layer of the coating layer has a thermal permeability of 5000 $J/s^{0.5} \cdot m^2 \cdot K$ or less.

Comparative Examples 1 to 4

A tool for friction stir welding in each of Comparative Examples 1 to 3 was fabricated using a method similar to that in Example 1 except that a coating layer was different in composition from the coating layer in Example 1 as shown in Table 2. Each layer constituting the coating layer having such a composition had a thermal permeability exceeding 5000 $J/s^{0.5} \cdot m^2 \cdot K$. In addition, as for a tool for friction stir welding in Comparative Example 4, a coating layer was not formed.

<Evaluation of Tool for Friction Stir Welding>

Friction spot joining (FSJ) was performed under the conditions shown in Table 1 above, and the wear resistance of each of the tools for friction stir welding in Examples 1 to 8 and Comparative Examples 1 to 4 fabricated in the above was evaluated. This evaluation was made by measuring the diameter of the probe portion for every 500 spots of friction spot joining, stopping friction spot joining when an amount of decrease in diameter exceeded 0.2 mm, and counting the number of spots joined before friction spot joining was stopped.

Table 3 below shows the number of spots joined in the above as evaluation results of the wear resistance of the tools for friction stir welding. Table 3 shows that as the number of joined spots is larger, more excellent wear resistance is achieved. "Less than 500" in the section "evaluation of wear resistance" in Table 3 means that the diameter of the probe portion decreases by 0.2 mm or more before 500 spots of friction spot joining.

TABLE 3

| No. | evaluation of wear resistance (number of spots) |
|---|---|
| Example 1 | 3800 |
| Example 2 | 3000 |
| Example 3 | 4500 |
| Example 4 | 4000 |
| Example 5 | 9000 |
| Example 6 | 4000 |
| Example 7 | 2500 |
| Example 8 | 2000 |
| Comparative Example 1 | 1000 |

TABLE 3-continued

| No. | evaluation of wear resistance (number of spots) |
|---|---|
| Comparative Example 2 | 500 |
| Comparative Example 3 | less than 500 |
| Comparative Example 4 | less than 500 |

As is clear from Table 3, the life of the tool for friction stir welding in each of Examples 1 to 8 is longer than that of the tool for friction stir welding in each of Comparative Examples 1 to 4. The reason for this is considered as follows: by using the tool for friction stir welding in which at least one layer of the coating layer has a thermal permeability of 5000 $J/s^{0.5} \cdot m^2 \cdot K$ or less, the thermal resistance of the base material is enhanced and the wear resistance is enhanced.

In addition, the joining efficiency of the tool for friction stir welding in each of Examples 1 to 8 is higher than that of the tool for friction stir welding in each of Comparative Examples 1 to 4. The reason for this is considered as follows: by using the tool for friction stir welding in which at least one layer of the coating layer has a thermal permeability of 5000 $J/s^{0.5} \cdot m^2 \cdot K$ or less, the frictional heat generated due to rotation of the tool for friction stir welding is conducted to the materials to be joined, and the temperature of the materials to be joined rises easily.

Based on the above results, it is confirmed that the life of the tool for friction stir welding according to the present invention in each of Examples 1 to 8 is longer than that of the tool for friction stir welding in each of Comparative Examples 1 to 4, and the joining efficiency of the former is higher than that of the latter.

It is recognized that the life of the tool for friction stir welding in Example 6 is longer than that of the tool for friction stir welding in Example 2. The reason for this is considered as follows: in the tool for friction stir welding in Example 2, the coating layer is formed on the entire surface of the base material. Therefore, heat of the tool for friction stir welding whose temperature has been raised due to conduction of the frictional heat cannot escape to the holder with which the tool for friction stir welding is in contact. As a result, the heat is confined within the base material and the temperature of the base material rises, which leads to a reduction in plastic deformation resistance.

While the embodiments and examples of the present invention have been described above, it is also originally intended to combine configurations of the above-mentioned embodiments and examples as appropriate.

It should be understood that the embodiments and examples disclosed herein are illustrative and not limitative in any respect. The scope of the present invention is defined by the terms of the claims, rather than the description above, and is intended to include any modifications within the scope and meaning equivalent to the terms of the claims.

REFERENCE SIGNS LIST

1 tool for friction stir welding; 2 base material; 3 coating layer; 4 probe portion; 5 cylindrical portion; 6 shoulder portion; 7 chuck portion

The invention claimed is:

1. A tool for friction stir welding comprising a base material and a coating layer formed on the base material, wherein said coating layer is formed of two or more layers, and includes one or more first heat insulating layers and one or more second heat insulating layers, said first heat insulating layer has a thermal permeability of 5000 $J/s^{0.5} \cdot m^2 \cdot K$ or less and is formed by a compound which is nitride or oxide of Al and of at least one or more elements selected from the group consisting of Ti, Si, Zr, Hf, and Cr, an atomic ratio of said Al to metal elements contained in said first heat insulating layer is 60% or more, said second heat insulating layer has the thermal permeability of 5000 $J/s^{0.5} \cdot m^2 \cdot K$ or less and is formed by a compound which is nitride or oxide of Si and of at least one or more elements selected from the group consisting of Al, Ti, Zr, Hf, and Cr, or a solid solution of the compound, and an atomic ratio of said Si to metal elements contained in said second heat insulating layer is 50% or more.

2. A tool for friction stir welding comprising a base material and a coating layer formed on the base material, wherein
said coating layer is formed of one or more layers, and at least one layer of said coating layer is a first heat insulating layer, said first heat insulating layer has a thermal permeability of 5000 $J/s^{0.5} \cdot m^2 \cdot K$ or less and is formed by a compound which is nitride or oxide of Al and of at least one or more elements selected from the group consisting of Ti, Si, Zr, Hf, and Cr, an atomic ratio of said Al to metal elements contained in said first heat insulating layer is 60% or more, and said coating layer includes a hexagonal crystal structure and/or an amorphous structure.

3. A tool for friction stir welding comprising a base material and a coating layer formed on the base material, wherein
said coating layer is formed of one or more layers, and at least one layer of said coating layer is a heat insulating layer, said heat insulating layer has a thermal permeability of 5000 $J/s^{0.5} \cdot m^2 \cdot K$ or less and is formed by a compound which is nitride or oxide of Si and of at least one or more elements selected from the group consisting of Al, Ti, Zr, Hf, and Cr, and an atomic ratio of said Si to metal elements contained in said heat insulating layer is 50% or more.

4. The tool for friction stir welding according to claim 3, wherein
a thickest layer of one or more layers forming said coating layer has the thermal permeability of 5000 $J/s^{0.5} \cdot m^2 \cdot K$ or less.

5. The tool for friction stir welding according to claim 3, wherein
said coating layer includes a hexagonal crystal structure and/or an amorphous structure.

6. The tool for friction stir welding according to claim 3, wherein
said tool for friction stir welding has a chuck portion inserted into a holder, and
said coating layer is formed on all or a part of a portion of said base material other than said chuck portion.

7. The tool for friction stir welding according to claim 3, wherein
said coating layer is formed at least on a portion of said base material that comes into contact with materials to be joined during joining processing.

8. The tool for friction stir welding according to claim 3, wherein
said coating layer does not have a crack extending from a surface of the coating layer to the base material.

9. The tool for friction stir welding according to claim 3, wherein
at least one layer of said coating layer is formed by a physical vapor deposition method.

10. A method for joining materials to be joined using the tool for friction stir welding as recited in claim 3, wherein
said joining is performed on the materials to be joined having a melting point of 1000° C. or higher.

* * * * *